United States Patent [19]
Pio et al.

[11] Patent Number: 5,792,670
[45] Date of Patent: Aug. 11, 1998

[54] METHOD OF MANUFACTURING DOUBLE POLYSILICON EEPROM CELL AND ACCESS TRANSISTOR

[75] Inventors: Federico Pio, Milan; Carlo Riva, Renate Brianza, both of Italy

[73] Assignee: SGS-Thomson Microelectronics S.r.l., Agrate Brianza, Italy

[21] Appl. No.: 475,671

[22] Filed: Jun. 6, 1995

Related U.S. Application Data

[62] Division of Ser. No. 199,075, Feb. 18, 1994, abandoned.

[30] Foreign Application Priority Data

Feb. 19, 1993 [EP] European Pat. Off. ............. 93830061
Feb. 19, 1993 [EP] European Pat. Off. ............. 93830062

[51] Int. Cl.$^6$ ..................... H01L 21/8247; H01L 21/265
[52] U.S. Cl. ........................... 437/43; 437/44; 437/45
[58] Field of Search ........................................ 437/43–45

[56] References Cited

U.S. PATENT DOCUMENTS

| Re. 35,356 | 10/1996 | Gill | 257/316 |
|---|---|---|---|
| 4,412,311 | 10/1983 | Miccoli et al. | 365/185 |
| 4,742,492 | 5/1988 | Smayling et al. | 365/218 |
| 4,852,062 | 7/1989 | Baker et al. | 365/185 |
| 4,996,571 | 2/1991 | Kume et al. | 357/23.5 |
| 5,079,603 | 1/1992 | Komori et al. | 357/23.5 |
| 5,081,054 | 1/1992 | Wu et al. | 437/43 |
| 5,194,929 | 3/1993 | Ohshima et al. | 257/326 |
| 5,258,949 | 11/1993 | Chang et al. | 365/185 |
| 5,326,999 | 7/1994 | Kim et al. | 275/315 |
| 5,337,274 | 8/1994 | Ohji | 365/185 |
| 5,338,956 | 8/1994 | Nakamura | 257/316 |
| 5,403,764 | 4/1995 | Yamamoto et al. | 437/48 |
| 5,486,480 | 1/1996 | Chen | 437/29 |

FOREIGN PATENT DOCUMENTS 0 079 636  5/1983  European Pat. Off. ........ H01L 29/60
0 379 693  8/1990  European Pat. Off. ........ G11C 16/06

OTHER PUBLICATIONS

Jin–Yeong Kang and Sang–soo Lee, "Fabrication and Operational Stability of Inverted Floating Gate E$^2$PROM (Electrically Erasable Programmable Read Only Memory)," *Japanese Journal of Applied Physics*, 30(4):627–632, 1991, Month Unknown.

Cappelletti et al., "Failure Mechanisms of Flash Cell in Program/Erase Cycling," IEEE, pp. 11.1–11.13, 1994, Month Unknown.

Keeney et al., "Complete Transient Simulation of Flash EEPROM Devices," *IEEE Transactions on Elec.* 39(12):2750–2756, 1992, Month Unknown.

Bampi et al., "A Modified Lightly Doped Drain Structure for VLSI MOSFET's," *IEEE Transactions on Electron Devices* 33(11):1769–1779, 1986, Month Unknown.

*Primary Examiner*—John Niebling
*Assistant Examiner*—Richard A. Booth
*Attorney, Agent, or Firm*—David V. Carlson; Bryan A. Santarelli; Seed and Berry LLP

[57] ABSTRACT

A method for programming a two-level polysilicon EEPROM memory cell, which cell is implemented in MOS technology on a semiconductor substrate and comprises a floating gate transistor and a further control gate overlying the floating gate with a dielectric layer therebetween, provides for the application of a negative voltage to the control gate during the cell write phase. This enables the voltages being applied across the thin tunnel oxide layer to be distributed so as to reduce the maximum amount of energy of the "holes" and improve the oxide reliability. In addition, by controlling the rise speed of the impulse to the drain region during the write phase, and of the impulse to the control gate during the erase phase, the maximum current flowing through the tunnel oxide can be set and the electric field being applied to the tunnel oxide kept constant, thereby the device life span can be extended.

10 Claims, 6 Drawing Sheets

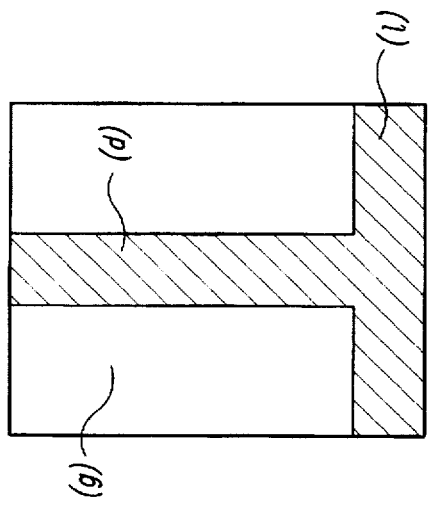
Fig. 1A ACTIVE AREAS
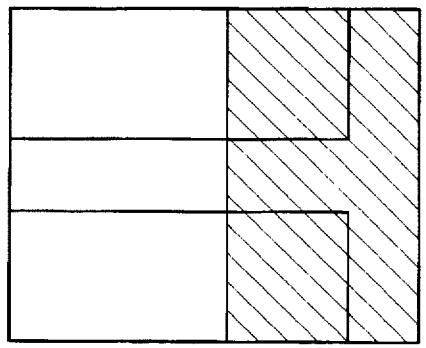
Fig. 1B TUNNEL OXIDE EPM IMPLANT
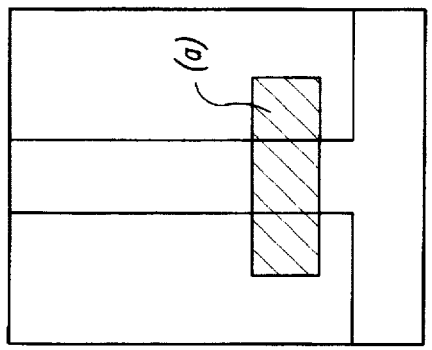
Fig. 1C FLOATING GATE
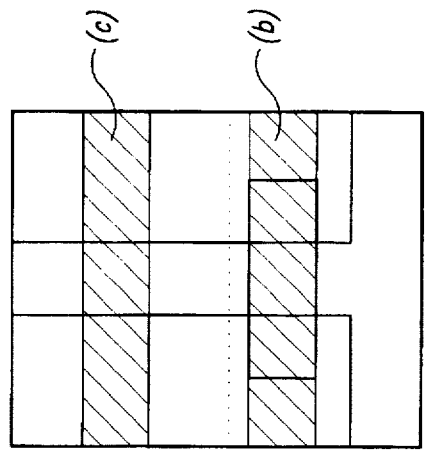
Fig. 1D POLY 2
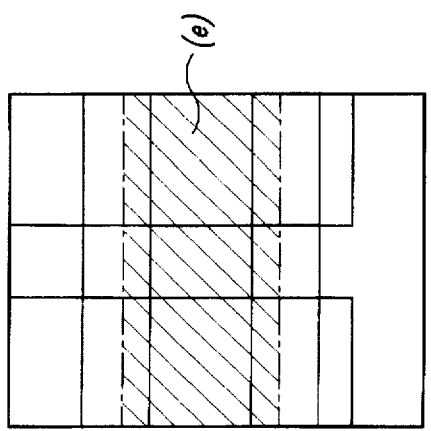
Fig. 1E PHOSPHORUS IMPLANT
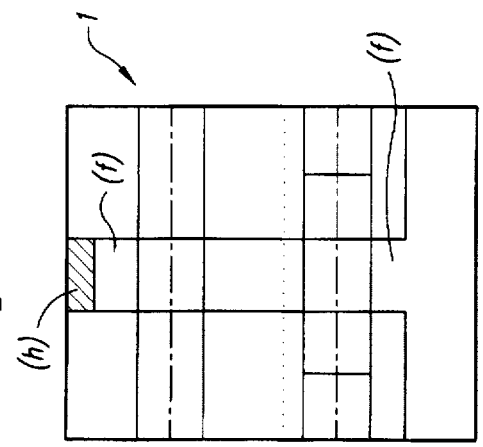
Fig. 1F CONTACT

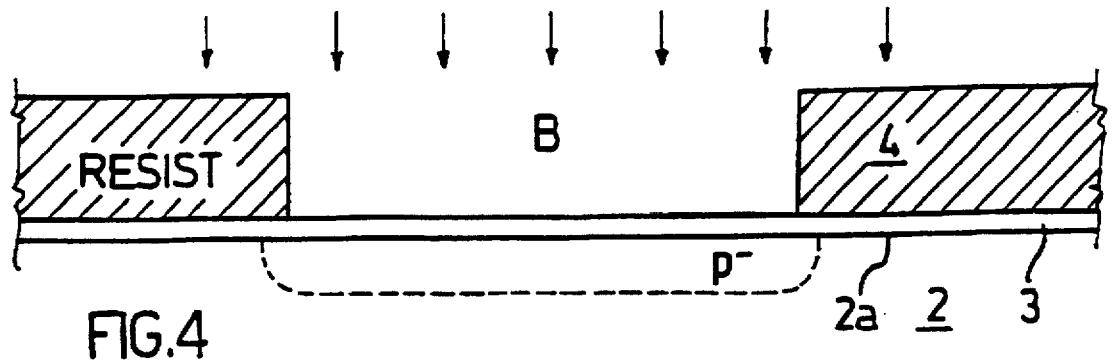
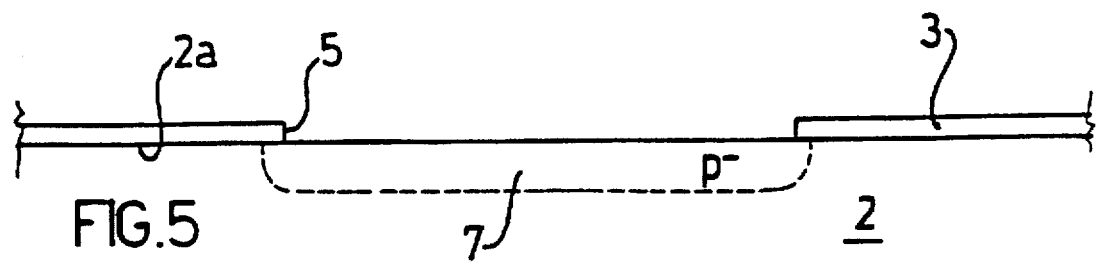
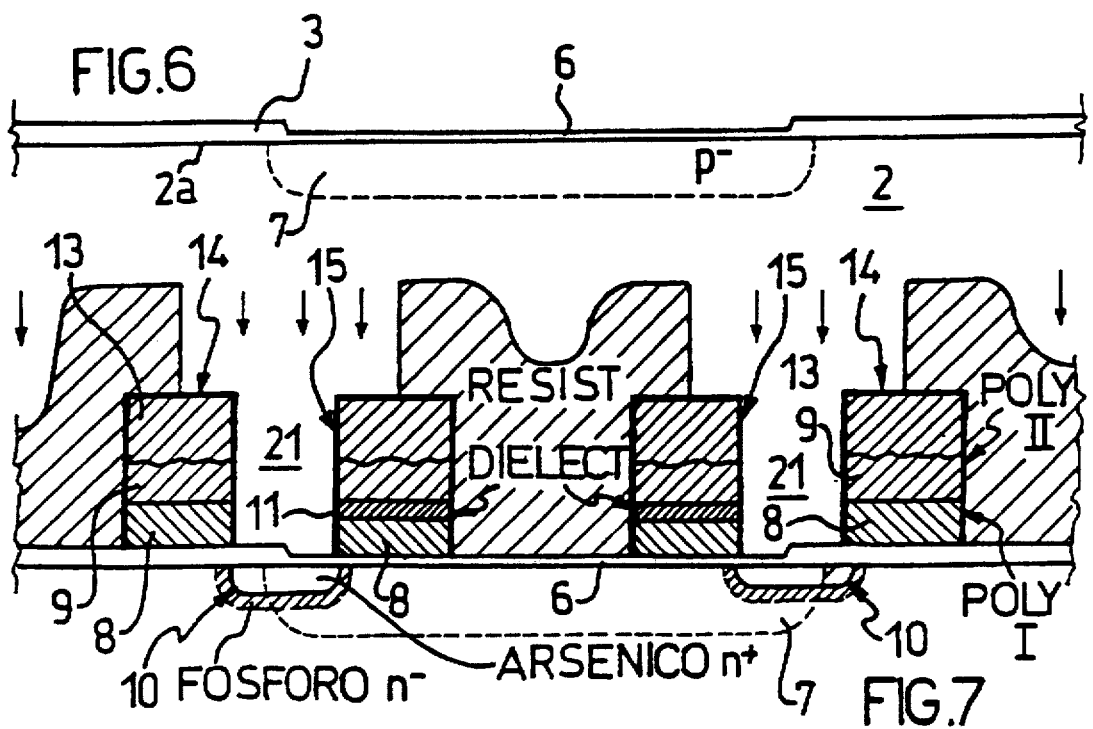

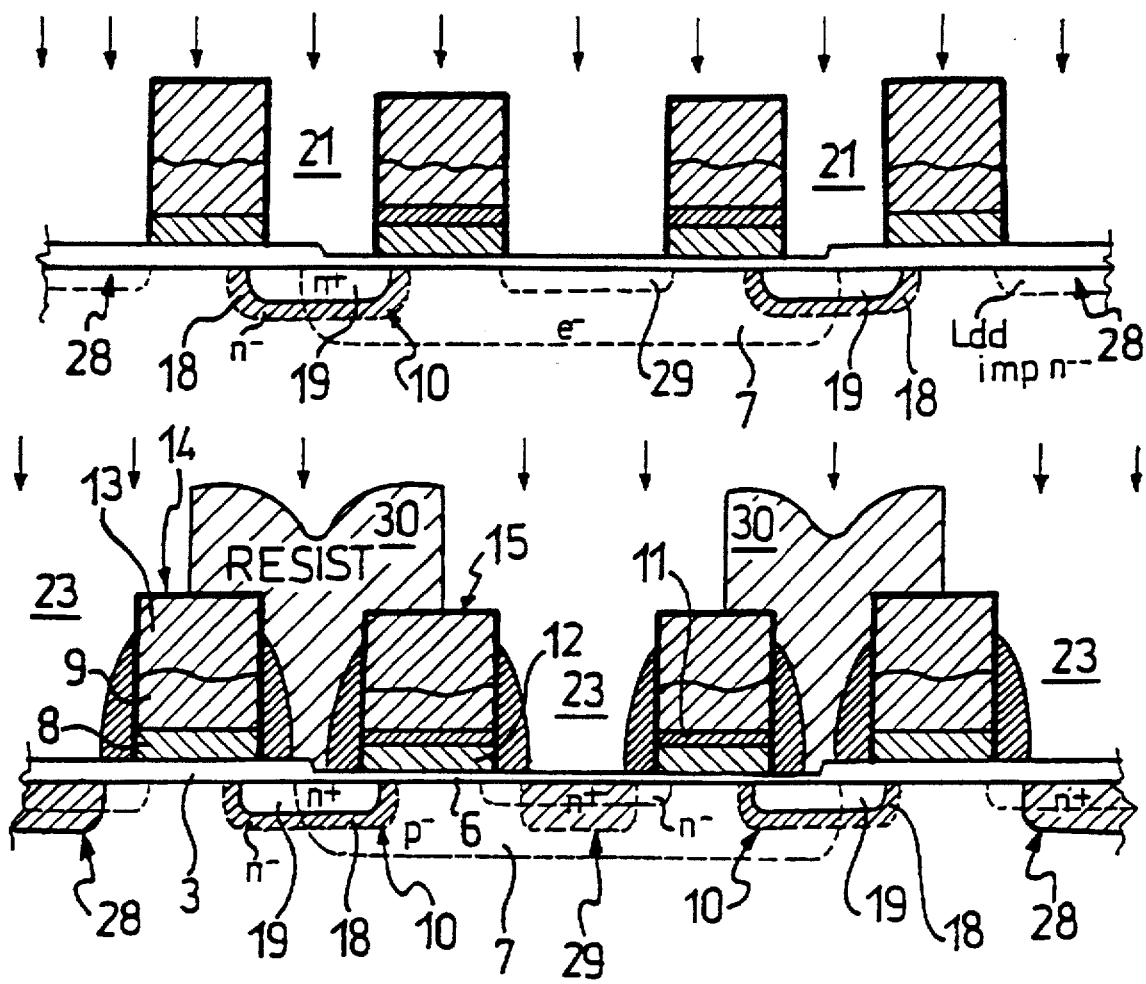

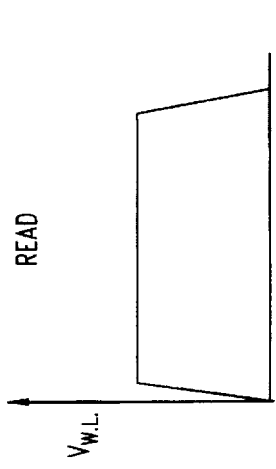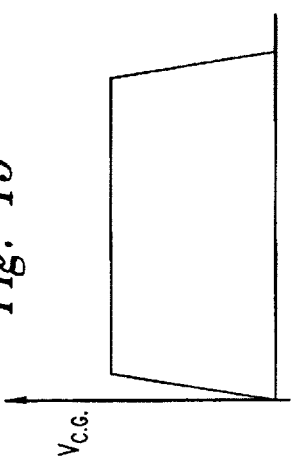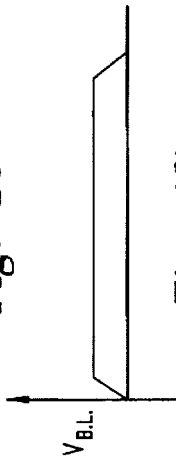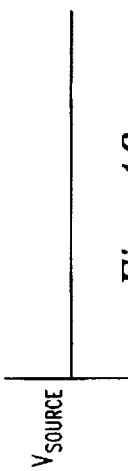
Fig. 15  Fig. 16  Fig. 17  Fig. 18
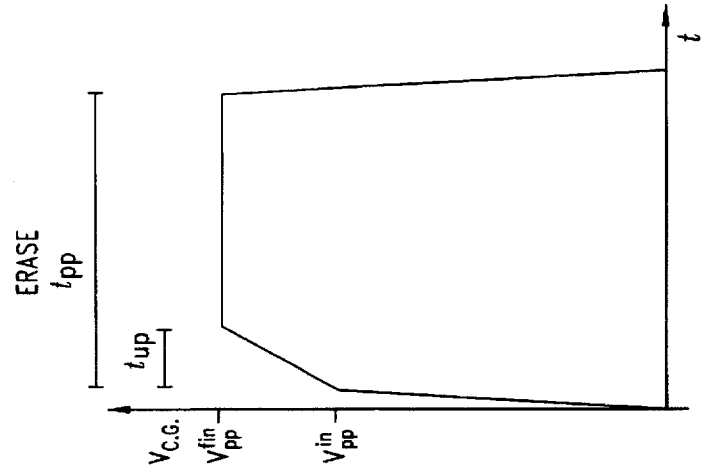
Fig. 13  Fig. 14
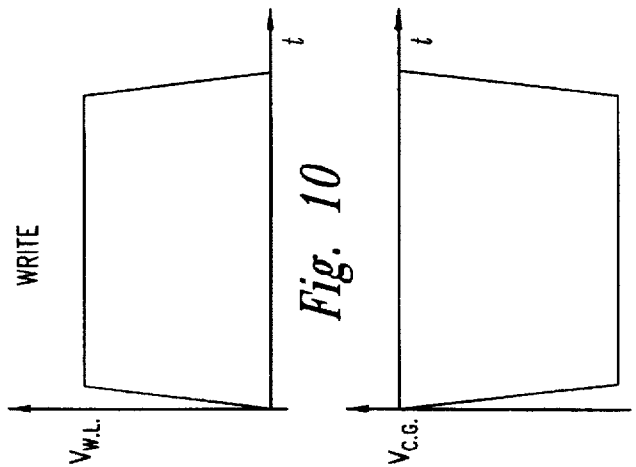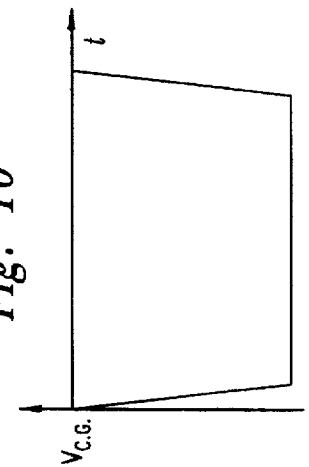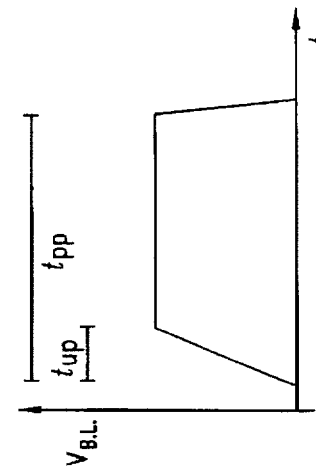
Fig. 10  Fig. 11  Fig. 12

METHOD OF MANUFACTURING DOUBLE POLYSILICON EEPROM CELL AND ACCESS TRANSISTOR

CROSS-REFERENCE TO RELATED APPLICATION

This application is a division of U.S. patent application Ser. No. 08/199,075, filed Feb. 18, 1994 now abandoned.

TECHNICAL FIELD

This invention relates to an EEPROM memory cell having two levels of polysilicon, and in particular, to a two-level polysilicon EEPROM memory cell of a type having a floating gate transistor connected serially to a selection transistor and provided with a further control gate overlying the floating gate, an intermediate dielectric layer being interposed between said gates.

BACKGROUND OF THE INVENTION

As is well known, EEPROM memory structures, while being of the non-volatile type, allow the information stored therein to be altered electrically both during the write and the erase phases.

In essence, EEPROMs can have the state of any memory cells altered by tunneling electrons through a thin layer of silicon oxide.

The thin oxide region has a smaller area than the so-called floating gate whereinto the electric charge is stored.

Memory cells with the above-outlined construction are referred to as FLOTOX, and are described, for example, in an article entitled "Oxide reliability criterion for the evaluation of endurance performance of electrically erasable programmable read-only memories", Journal App. Phys. 71, No. 9, 1992.

This kind of EEPROM memories falls into two general classes: a first class provided with a single level of polysilicon, and a second class having two discrete levels of polysilicon.

Memories of the first class have an advantage in that they can be manufactured by a comparatively simple process; but the overall circuit space requirements are much higher, usually by a factor of 1.5 to 2.5.

This penalizes memories with a single level of polysilicon in all those applications which require high circuit density, e.g. in excess of one Megabit.

It should be noted here that memories of either classes, whether with one or two levels of polysilicon, use positive voltages for both writing and erasing purposes. These voltages range from 8 to 12 Volts in order to generate a sufficiently strong electric field across the thin oxide to effectively trigger the tunnel effect.

However, the use of these relatively high positive voltages may eventually result in the thin oxide layer becoming deteriorated.

SUMMARY OF THE INVENTION

Accordingly, one object of the present invention is to provide a two-level polysilicon EEPROM cell which has such structural and functional features as to enhance the reliability and lifetime of storage circuits implemented with such cells, while reducing the tunnel oxide deterioration.

Another object of this invention is to enable very high density integrated storage circuits so that such circuits may be produced in a much smaller circuit area, for a given technology. This is apt to drastically lower the manufacturing costs for high density storage circuits.

According to principles of the present invention, there is provided a novel cell configuration which allows the voltages applied across the thin tunnel oxide layer to be distributed.

Based on that solutive idea, the objects of the invention are achieved by an EEPROM memory cell described and claimed herein.

The objects of the invention are achieved by a memory cell programming method as described herein.

The objects of the invention are achieved by a memory cell manufacturing process.

The features and advantages of a memory cell according to the invention will become apparent from the following description of an embodiment thereof, given by way of example and not of limitation with reference to the accompanying drawings.

BRIEF DESCRIPTION OF THE DRAWINGS

In the drawings:

FIGS. 1A–1G are top plan views showing schematically the layout of a memory cell embodying this invention;

FIGS. 4 to 6 are respective schematic views showing, in vertical section and time succession, the initial steps of the manufacturing process to yield a pair of the cells shown in FIG. 1G;

FIGS. 7 to 9 are respective schematic views showing, in vertical section and time succession, the final steps of the manufacturing process to yield a pair of the cells according to the invention;

FIGS. 10 to 12 are respective schematic graphs showing the patterns of programming impulses versus time, during the cell write phase;

FIGS. 13 and 14 are respective schematic graphs showing the patterns of programming impulses versus time, during the cell erase phase; and, FIGS. 15 to 18 are respective schematic graphs showing the patterns versus time of impulses applied to the cell during the read phase.

DETAILED DESCRIPTION

Figure 1G:
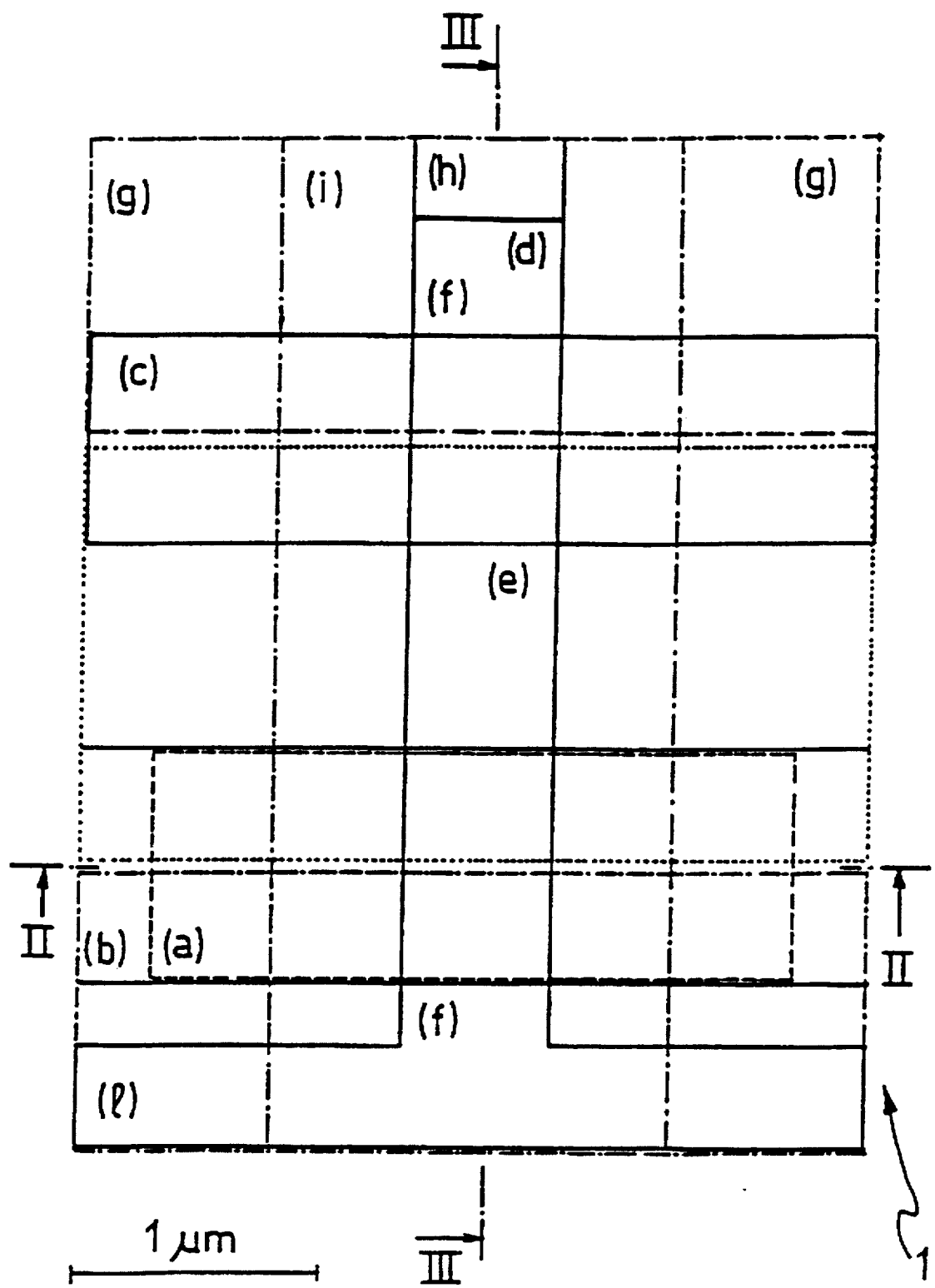

With reference to the drawing views, generally and schematically shown at 1 is an EEPROM memory cell embodying this invention. Understandably, the cell 1 would be a basic component of an integrated storage circuit incorporating thousands of identical cells in a matrix.

The structure of this cell 1 will next be described with cross reference to the steps of its manufacturing process.

The cell 1 is of the so-called two-level polysilicon type and has a basic structure which is consistent with a Flash cell of the ETOX type. In brief, the core of the memory cell comprises a MOS transistor having a floating gate 12 where the electric charge is stored which allows identification of the two discrete cell states of "write" and "erase".

The floating gate 12 is represented in FIG. 1C and FIG. 1G by a region (a) contoured by a dash line.

Provided above the floating gate 12 is a control gate electrode 15 comprising two overlapping layers of polysilicon 9 and silicide 13. In FIG. 1D and FIG. 1G, the control gate is represented by a region (b).

The control gate 15 is coupled capacitively to the floating gate 12 through an intervening dielectric layer 11, referred to as the interpoly layer dielectric. A voltage is transferred through this dielectric layer 11 to the floating gate 12 from the control gate 15 during the cell 1 write and/or erase phases.

Advantageously, the control gate electrode 15 is shared by all the cells forming one row or domain in the integrated storage circuit.

Connected serially to the floating-gate transistor of the cell 1 is a so-called selection transistor 14 which is designed to only operate at low voltages in the 5 to 7 Volts range. Region (c) in FIG. 1D and FIG. 1G shows the location of the word line which contains this selection transistor 14.

The gate of this transistor 14 is also formed of a double layer of polysilicon 9 and silicide 13, and is shared by all the cells in one row of the integrated matrix.

Figure 3:
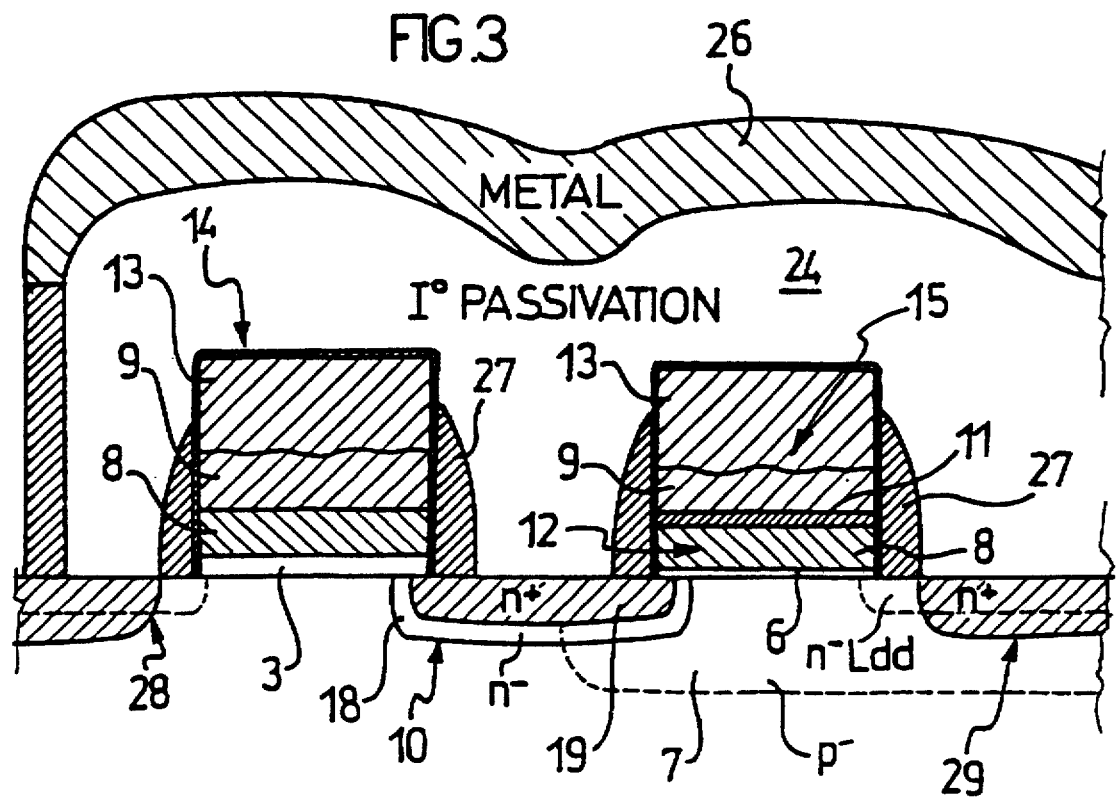
FIG. 3 is an enlarged scale, schematic view showing a vertical section through that same semiconductor portion but taken along line III—III in FIG. 1G.

Associated with the transistor 14 are active areas 20, shown in FIG. 3 and indicated in FIG. 1A and FIG. 1G by a region (d).

Advantageously according to the invention, provided between the respective gate terminals of the selection transistor 14 and the cell 1 is a region 10 which has at least a double implant of the same dopant type at two different concentrations and/or energies thereof.

In the instance considered, the dopant is of the N type and the implantation is effected using Phosphorus and Arsenic ions. Such a dual implant has shown to be specially effective to keep the so-called band-to-band (BTB) current low during the cell write phase.

In FIG. 1E and FIG. 1G, the region 10 is denoted by the character (e). This region 10 is formed by carrying out a first Phosphorus implantation at a low concentration of dopant N− and a subsequent, heavier implantation of Arsenic N+. Advantageously, the transistors forming the cell 1 have drain 28 and source 29 active regions of the selection transistor 14 and the floating-gate transistor respectively, obtained with an LDD (lightly doped drain) technology.

The reference character (f) denotes in FIG. 1F and FIG. 1G the drain and source regions of the cell 1. Indicated at (h) is, moreover, a drain contact in common with the cell 1 and a second cell which is formed above cell 1. This second cell is not explicitly shown as it is symmetrical with cell 1.

The reference character (i) in FIG. 1G denotes an interconnection metallic line between the drain contacts of cells in the same column of the cell matrix which makes up the integrated storage circuit.

Lastly, the reference character (1) in FIG. 1A and FIG. 1G denotes a line interconnecting the source regions which is shared by all the cells in the same row or domain of the matrix. This interconnection line (1) is also common to the source regions in the underlying row of symmetrical cells within the integrated circuit matrix.

Steps of the process for manufacturing memory cells according to the invention will now be described in detail.

The cell 1 is formed on a semiconductor substrate 2 with a 0.8 μm technology and having a control gate-to-floating gate capacitive coupling of about 0.6–0.7.

A gate oxide layer 3 is grown on the surface 2a of the substrate 2 by thermal oxidation. This layer 3 is specifically intended for the selection transistor 14.

Using a conventional photolithographic technique whereby a layer 4 of a photoresist is deposited over the oxide 3, followed by etching, an aperture 5 is cut in the oxide layer 3 to define specifically the floating-gate transistor, as shown in FIG. 5. This aperture 5 will substantially expose again the surface 2a of the substrate 2.

Before the etching phase, an elongated channel region 7 which extends to beneath the opposite edges of the layer 3 is formed, proximate to the surface 2a, beneath the aperture 5 by ion implantation. The implantation is carried out using Boron ions to provide doping of the P− type in the region 7.

Figure 2:
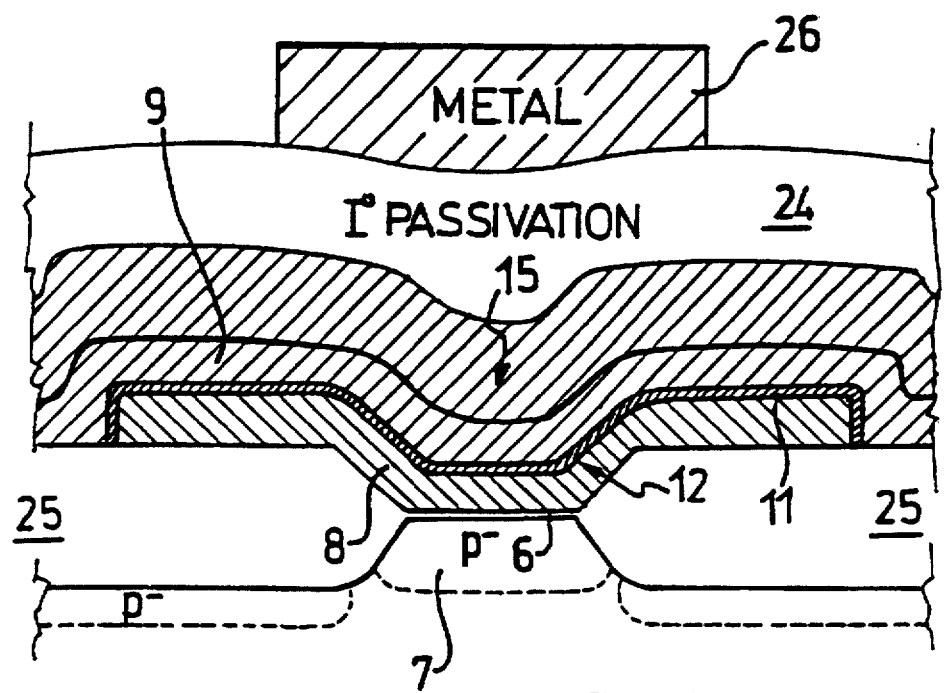
FIG. 2 is an enlarged scale, schematic view showing, in a vertical section taken along line II—II in FIG. 1G, a semiconductor portion on which the cell of this invention has been formed.

At this time, a thin oxide layer 6, referred to as the tunnel oxide hereinafter, is grown by thermal oxidation within the aperture 5. This tunnel oxide 6 is bounded laterally by opposite field oxide regions 25, as shown in FIG. 2 and denoted in FIG. 1 by the reference character (g).

The field oxide 25 delimits the active areas of the transistor with respect to the gate terminal.

Subsequent processing steps, known per se, will provide first 8 and second 9 polysilicon layers together with a silicide layer 13, intended for the structures of the floating gate 12 and the associated control gate 15 of the floating-gate transistor, as well as of the gate of the selection transistor 14.

Provided over the floating gate 12 between the first 8 and second 9 polysilicon layers, is the interpoly dielectric layer 11. The layer 11 may be left also on the selection transistor 14 if the first 8 and second 9 polysilicon layers are shortened on the field oxide. Using a photolithographic technique, respective apertures 21 are defined, throughout the layers 13, 9, 11 and 8, as far as the oxide layers 3 and 6, as shown in FIG. 7. These apertures 21 are cut between the respective gate terminals of each floating-gate transistor and each selection transistor 14 associated therewith resulting in a self-aligned structure.

A subsequent step of double ion implantation yields regions 10 which have two different concentrations of the same dopant type and extend partially under the floating gate 12.

Specifically, an implantation followed by diffusion of Phosphorus ions enables a first region 18 doped N− to be defined. This first region 18 will receive a second region 19 to be formed by implantation and successive diffusion with Arsenic ions.

This second Arsenic implant is heavier than the previous Phosphorus implant, and the region 19 will have a concentration of dopant of the N+ type. The concentration gradient of the dopant N between the regions 18 and 19 lowers the so-called tunneling of the band-to-band current during the cell "write" phase. Similarly, shown schematically in FIG. 8 and FIG. 9 are the implantation steps which also enable the active drain and source areas 28 and 29 of selection transistor 14 and floating-gate transistor, respectively, to be doped.

Advantageously, this process step is carried out using a technique known as LDD at a low dopant concentration.

Both the drain area 28 of the selection transistor 14 and source area 29 of the floating gate transistor comprising the cell 1 are denoted by the reference character (f) in FIG. 1F and FIG. 1G.

At this stage, so-called spacers 27 are formed.

Moreover, a masking step with photoresist 30 protects the aperture 21 and allows fresh apertures 23 to be opened. An implantation is carried out with Arsenic N+ ions to complete the doping of the active areas 28 and 29, as shown in FIG. 9.

The process steps are completed with the deposition of a passivating layer 24, the formation of contact openings 30, and the provision of the final metallization layer 26. These, the very last, steps of the process are carried out in a conventional manner.

The method for programming the memory cell of this invention will now be described. In fact, the peculiarly innovative structure of this cell 1 allows it to be programmed in quite unique a manner.

For cell writing and erasing in conventional storage circuits, positive voltage pulses are applied to the cell terminals in order to generate a sufficient electric field to cause a current flow through the tunnel oxide layer.

By contrast, in the cell 1 of this invention, a negative voltage is used for application to the control gate 15 during the write phase.

Shown by way of example in the following Table are the values of the voltages to be applied across the cell 1. For each of the write, erase and read phases, there are specified the voltage values at the control gate 15, the bit line (drain contact), word line (gate of the selection transistor 14), and source diffusion 29.

TABLE

|  | C.G. | B.L. | W.L. | Source |
| --- | --- | --- | --- | --- |
| WRITE | −8 V | 5 V | 7 V | floating |
| ERASE | 15 V | 0 V | 5 V | floating |
| READ | 3 V | 1 V | 5 V | 0 V |

When such negative voltage is used, the voltage being applied to the drain terminal can be reduced while retaining through the thin oxide 6 an electric field of the same level as in conventional cells.

This will reduce the maximum energy of the holes generated by the band-to-band current at the junction of the drain region. Accordingly, the deterioration of the thin tunnel oxide can be greatly reduced.

As shown in FIGS. 10 to 18, the programming impulses applied during the write phase to the drain contact, or applied during the erase phase to the control gate, are characterized by a rise speed that, in conjunction with the applied voltage values, will set the maximum current level through the thin oxide 6. By controlling this rise speed, the overall reliability of the cell can be improved while lowering the tunnel oxide stress.

In fact, during the write phase, control of the rise speed of the impulse on the bit line is effective to keep the electric field being applied across the tunnel oxide 6 constant over time. In this way the breakdown phenomenon attendant to the gate terminal voltage can be also controlled. In a similar way, during the erase phase, control of the rise speed values of the impulse at the control gate 15 enables the electric field being applied across the tunnel oxide 6 to be kept constant over time.

For completeness of discussion, it should be noted that it is only during the write phase that all the memory cells in one and the same word line could undergo stress from the negative voltage. This is because the cells are applied an electric field tending to deteriorate the informational content thereof.

However, this possible shortcoming can be fully controlled by suitable adjustment of the negative voltage value.

In this respect, in actual tests, using a programming time of 5 msec. durations of at least 100 k programming cycles have been obtained with no performance deterioration and no significant loss of information from the programming of other cells in the same row or domain of the cell matrix.

The memory cell of this invention does solve the prior art problems, and affords a number of advantages as specified herein below.

The particular self-aligned structure of the cell 1 allows it to be compacted, for a given technology, within an area which is less than one half that occupied by a conventional two-level polysilicon cell.

The use of a negative voltage to the control gate 15 of the cell, during the write phase, allows the required voltage across the tunnel oxide 6 to be distributed so as to provide the programming current sought. This also enables a standard selection transistor 14 to be used, and the use of a high voltage transistor avoided. In fact, the voltage which is transferred to the drain region of the cell is substantially on the order of 4–6 Volts.

The use of a suitable rise speed for the write and erase impulses allows the maximum current level through the tunnel oxide to be controlled and kept constant over time. Thus, the cell performance and long-term reliability can be improved by that the deterioration is reduced of the thin silicon oxide 6 subjected to the tunnel effect.

Also, the oxide deterioration problems which are typical of the Flash-type memory cells can be much attenuated.

In view of that the operation of the inventive cell is based on a Fowler-Nordheim tunnel effect and that its inherent threshold can be selected close to zero, the instant structure will specially suit low supply voltage applications, even ones as low as 3 Volts.

The overall electric length of the inventive cell is greater than that of a Flash cell, and in addition:

with the source being formed by the LDD method, the heavy Arsenic implant, peripherally of the source and the drain regions, can be held away from the cell gate.

The last-mentioned features of the invention are advantageous for very large scale integration of the inventive cell, increasing its effective electric length and allowing it to be scaled down to uniquely small sizes.

Understandably, changes and modifications may be made to the memory cell as described and illustrated in the foregoing without departing from the invention scope as defined in the appended claims.

We claim:

1. A manufacturing process for a dual-level polysilicon EEPROM memory cell on a semiconductor substrate including at least one memory cell that includes respective drain and source regions, a floating-gate transistor, and an access transistor, the process comprising:

forming a gate for said access transistor over a first region of said substrate, the first region being contiguous with the drain region;

forming a floating-gate structure for said floating-gate transistor over a second region of said substrate, the second region being contiguous with the source region, implanting a first concentration of a first dopant conductivity type into a third region of said substrate that is disposed between said gate and said floating-gate structure;

implanting a second concentration of the first dopant conductivity type into said third region;

implanting a third concentration of the first dopant conductivity type into the third region, the drain region, and the source region, the third concentration being less than the second concentration;

forming sidewall spacers on the gate and the floating-gate structure after implanting dopants at the first, second, and third concentrations; and after forming the sidewall spacers, implanting a fourth concentration of the first dopant conductivity type into the drain and source regions, the fourth concentration being greater than the third concentration.

2. A process according to claim 1 wherein:

the implanting a first concentration comprises implanting an N− concentration of a dopant; and the implanting a second concentration comprises implanting an N+ concentration of a dopant.

3. A process according to claim 1 wherein:

the implanting a first concentration comprises implanting phosphorous, and the implanting a second concentration comprises implanting arsenic.

4. A process according to claim 1 wherein:

the implanting a first concentration comprises implanting the first concentration into a portion of a floating-gate channel region of the substrate, the portion contiguous with the third region, and the implanting a second concentration comprises implanting the second concentration into the portion of the floating-gate channel region.

5. A method, comprising:

forming an insulator on a substrate that includes a drain region, a shared region, a source region, a selection-channel region disposed between and contiguous with the drain and shared regions, and a floating-gate-channel region disposed between and contiguous with the source and shared regions;

forming a gate of a selection transistor over the selection-channel region;

forming floating and control gates of a floating-gate transistor over the floating-gate-channel region;

double diffusing with a first conductivity type of impurity the shared region and portions of both channel regions that are contiguous with the shared region;

after the double diffusing, lightly doping the source and drain regions;

after the lightly doping, heavily doping a portion of the source region that is spaced from the floating-gate-channel region, and heavily doping a portion of the drain region that is spaced from the selection-channel region.

6. The method of claim 5 wherein the double diffusing comprises:

diffusing a first dopant a first depth into the substrate and a first lateral distance into both of the channel regions; and diffusing a second dopant a second depth into the substrate and a second lateral distance into both of the channel regions, the second depth and the second lateral distance respectively less than the first depth and the first lateral distance.

7. The method of claim 5 wherein the double diffusing comprises:

diffusing phosphorous a first depth into the substrate and a first lateral distance into both of the channel regions; and diffusing arsenic a second depth into the substrate and a second lateral distance into both of the channel regions, the second depth and the second lateral distance respectively less than the first depth and the first lateral distance.

8. The method of claim 5 wherein the double diffusing comprises:

diffusing a first concentration of a first dopant a first depth into the substrate and a first lateral distance into both of the channel regions; and diffusing a second concentration of a second dopant a second depth into the substrate and a second lateral distance into both of the channel regions, the second depth and the second lateral distance respectively less than the first depth and the first lateral distance.

9. The method of claim 5, further comprising forming spacers on sides of the gate, floating gate, and control gate after lightly doping but before heavily doping the source and drain regions.

10. The method of claim 5 wherein forming an insulator comprises forming a tunnel dielectric over the floating-gate-channel region and forming a gate dielectric over the selection-channel region, the tunnel dielectric thinner than the gate dielectric.

* * * * *